United States Patent
Tada

[19]

[11] Patent Number: 6,058,040
[45] Date of Patent: May 2, 2000

[54] FERROELECTRIC MEMORY

[75] Inventor: Yoshihiro Tada, Kyoto, Japan

[73] Assignee: Rohm Co., Ltd., Kyoto, Japan

[21] Appl. No.: 09/080,398

[22] Filed: May 18, 1998

[30] Foreign Application Priority Data

May 19, 1997 [JP] Japan .................................. 9-128396

[51] Int. Cl.$^7$ ................................................ G11C 11/22
[52] U.S. Cl. .......................................... 365/145; 365/149
[58] Field of Search ..................................... 365/145, 149

[56] References Cited

FOREIGN PATENT DOCUMENTS 7-220482  8/1995  Japan .

Primary Examiner—David Nelms
Assistant Examiner—M. Tran
Attorney, Agent, or Firm—Arent, Fox Kintner, Plotkin & Kahn

[57] ABSTRACT

A ferroelectric memory has a smaller circuit area and offers lower current consumption, higher reliability, and a longer working life than ever. In this ferroelectric memory, one end of a capacitor is connected, through a switching device that is provided for achieving connection to a divided plate line and is turned on and off by a word line, to the divided plate line, and the divided plate line is connected, through another switching device that is provided for achieving connection to a plate line and is turned on and off by a column line, to the plate line for controlling the writing and reading of data. The other end of the capacitor is connected, through another switching device that is turned on and off by the word line, to a bit line, and the bit line is connected, through another switching device that is turned on and off by the column line, to an input/output line for controlling the writing and reading of data.

8 Claims, 3 Drawing Sheets tric capacitors C-111' and C-112 receive a positive voltage on their bit line (BL-11' and BL-12) side and receive a negative voltage on their plate line (PL-1) side (hereafter referred to as "receiving a positive voltage"), and therefore they shift their state of polarization to P1.

FERROELECTRIC MEMORY

BACKGROUND OF THE INVENTION

1. Field of the Invention

The present invention relates to a ferroelectric memory, which is a semiconductor data-storage device that employs capacitors having ferroelectric material sandwiched between two electrodes.

2. Description of the Prior Art

FIG. 2 shows a circuit diagram of a conventional ferroelectric memory. In FIG. 2, WL-h (h=1, . . . , m) represents a word line; CL-i (i=1, . . . , n) represents a column line; PL-h represents a plate line; BL-i1, BL-i1', BL-i2, and BL-i2' represent bit lines; I/O-1 and I/O-2 represent data input/output lines; C-hi1, C-hi1', C-hi2, and C-hi2' represent capacitors having ferroelectric material sandwiched between two electrodes (hereafter referred to as "ferroelectric capacitors"); T-hi1, T-hi1', T-hi2, T-hi2', T-i1, and T-i2 represent n-channel MOS field-effect transistors (hereafter referred to simply as "MOS transistors"); SA-i1 and SA-i2 represent sense amplifiers; and ADD-hi represents the address of the intersection between the h-th row and the i-th column.

These elements are interconnected as follows. The ferroelectric capacitors C-hi1, C-hi1', C-hi2, and C-hi2' have one end connected through the drain-source channel of the MOS transistors T-hi1, T-hi1', T-hi2, and T-hi2' to the bit lines BL-i1, L-i1', BL-i2, and BL-i2', respectively, and have the other end connected to the plate line PL-h. The gates of the MOS transistors T-hi1, T-hi1', T-hi2, and T-hi2' are connected to the word line WL-h.

The bit lines BL-i1 and BL-i1' are connected to one end of the sense amplifier SA-i1, and the bit lines BL-i2 and BL-i2' are connected to one end of the sense amplifier SA-i2. The sense amplifiers SA-i1 and SA-i2 have their other end connected through the drain-source channel of the MOS transistors T-i1 and T-i2 to the data input/output lines I/O-1 and I/O-2, respectively.

Thus, the address ADD-hi of the intersection between the h-th row and the i-th column points to a part of the ferroelectric memory that consists of four ferroelectric capacitors C-hi1, C-hi1', C-hi2, and C-hi2' and four MOS transistors T-hi1, T-hi1', T-hi2, and T-hi2'.

Here, a brief description will be given as to the polarization of a ferroelectric capacitor. As FIG. 3 shows, the relationship between the voltage applied to a ferroelectric capacitor and the state (i.e. the direction and degree) of polarization it exhibits describes a hysteresis loop. Accordingly, even when the applied voltage returns to zero, a certain degree of polarization remains stably (P3 and P4 in FIG. 3). For example, when the applied voltage varies from a sufficiently high positive voltage to zero, the state of polarization shifts from P1 to P3 of FIG. 3; when the applied voltage varies from a sufficiently high negative voltage to zero, the state of polarization shifts from P2 to P4 of FIG. 3. Note that, in the following descriptions, the symbols P1, P2, P3, and P4 invariably refer to those shown in FIG. 3.

A ferroelectric memory exploits this change in the state of polarization of a ferroelectric capacitor between P3 and P4 in order to store therein a binary digit, namely "1" or "0". For example, the state of polarization at P3 is used to represent "0", and the state of polarization at P4 is used to represent "1". Accordingly, a ferroelectric memory is a nonvolatile memory that can hold the data stored therein even while it is not receiving electric power.

The ferroelectric memory is composed of so-called 2T2C-type memory cells. That is, two ferroelectric capacitors C-hix and C-hix' and two MOS transistors T-hix and T-hix' (where x=1, 2) make up one memory cell. And two memory cells make up one address ADD-hi, so that two bits of data can be held at one address.

The writing of data is performed as follows. Prior to the writing of data, the voltages on all word lines WL-h, all column lines CL-i, and all plate lines PL-h drop to a low level, and all sense amplifiers SA-h1 and SA-h2 are activated. Then, for example in a case where two bits of data "1, 0" are going to be written to the address ADD-11 that points to the intersection between the first row and the first column, the word line WL-1 and the column line CL-1 rise to a high level.

As a result, the MOS transistors T-1ix and T-1ix' turn on, connecting the ferroelectric capacitors C-1ix and C-1ix' to the bit lines BL-ix and BL-ix', and the MOS transistor T-1x turns on, connecting the sense amplifier SA-1x to the data input/output line I/O-x. Eventually, only the ferroelectric capacitors C-11x and C-11x', which make up one of the memory cells that constitute the address ADD-11, are connected between the plate line PL-1 and the data input/output line I/O-x (hereafter, this state of an address will be referred to as its "selected" state).

Here, the sense amplifier SA-ix is an amplifier whose input/output direction can be switched in accordance with a control signal fed thereto from outside, and it is additionally provided with a latching function for temporarily holding data. Specifically, during the writing of data, the sense amplifier SA-ix amplifies the voltage on the data input/output line I/O-x, and outputs the amplified voltage as it is to the bit line BL-ix and after inverting it to the bit line BL-ix'. On the other hand, during the reading of data, the sense amplifier SA-ix compares the potential difference between the bit lines BL-ix and BL-ix' with a reference voltage, and, in accordance with the result of the comparison, outputs a high-level or low-level voltage to the data input/output line I/O-x; that is, it judges whether the potential difference between the bit lines BL-ix and BL-ix' corresponds to a binary "1" or "0".

As a result, in the case under discussion, where it is assumed that two bits of data "1, 0" are written, when the data input/output line I/O-1 rises to a high level, which corresponds to a binary "1", and the data input/output line I/O-2 drops to a low level, which corresponds to a binary "0", the input of the sense amplifier SA-11 rises to a high level, causing the voltage on the bit line BL-11 to rise to a high level and the voltage on the bit line BL-11' to drop to a low level, and the input of the sense amplifier SA-12 drops to a low level, causing the voltage on the bit line BL-12 to drop to a low level and the voltage on the bit line BL-12' to rise to a high level.

As a result, the ferroelectric capacitors C-111 and C-112' receive a voltage such that their bit line (BL-11 and BL-12') side becomes positive and their plate line (PL-1) side becomes negative (hereafter referred to as "receiving a negative voltage"), and therefore they shift their state of polarization to P2. On the other hand, the ferroelectric capacitors C-111' and C-112 receive a zero voltage, and therefore they shift their state of polarization to P3 or P4 depending on their previous state of polarization.

Next, when the voltage on the plate line PL-1 rises to a high level, the ferroelectric capacitors C-111 and C-112' receive a zero voltage, and therefore they shift their state of polarization from P2 to P4; on the other hand, the ferroelectric capacitors C-111' and C-112 receive a voltage such that their plate line (PL-1) side becomes positive and their bit line (BL-11' and BL-12) side becomes negative (hereafter referred to as "receiving a positive voltage"), and therefore they shift their state of polarization from P3 or P4 to P1.

Next, when the voltage on the plate line PL-1 drops to a low level, the ferroelectric capacitors C-111 and C-112' receive a negative voltage, and therefore they shift their state of polarization from P4 to P2; on the other hand, the ferroelectric capacitors C-111' and C-112 receive a zero voltage, and therefore they shift their state of polarization from P1 to P3.

Next, when the voltages on the word line WL-1 and the column line CL-1 drop to a low level, the MOS transistors T-1ix and T-1ix' turn off, disconnecting the ferroelectric capacitors C-1ix and C-1ix' from the bit lines BL-ix and BL-ix', respectively, and the MOS transistor T-1x turns off, disconnecting the sense amplifier SA-1x from the data input/output line I/O-x (i.e. the address ADD-11 returns to its "non-selected" state).

This is the end of the process of writing two bits of data "1, 0" to the address ADD-11 that points to the intersection between the first row and the first column. At this time, the state of polarization of the ferroelectric capacitors C-111 and C-111' is at P4 and P3, respectively, and the state of polarization of the ferroelectric capacitors C-112 and C-112' is at P3 and P4, respectively. Note that, although the state of polarization of the ferroelectric capacitors C-111 and C-112' is at P2 immediately after the writing of the two-bit data "1, 0" to the address ADD-11, a leak current flowing through the MOS transistors make their state of polarization eventually settle to P4.

In short, a binary "1" is represented by making two adjacent ferroelectric capacitors C-hix and C-hix' shift their state of polarization to P4 and P3, respectively, and a binary "0" is represented by making two adjacent ferroelectric capacitors C-hix and C-hix' shift their state of polarization to P3 and P4, respectively. That is, a binary "1" or "0" is written to a specific address by stabilizing the two ferroelectric capacitors C-hix and C-hix' constituting one memory cell in one of two opposite combinations of different states of polarization for "1" and "0".

The reading of data is performed as follows. Prior to the reading of data, the voltages on all word lines WL-h, all column lines CL-i, and all plate lines PL-h drop to a low level, and all sense amplifiers SA-h1 and SA-h2 are deactivated. Then, for example in a case where data is going to be read from the address ADD-11 that points to the intersection between the first row and the first column, the word line WL-1 and the column line CL-1 rise to a high level, and thus the address ADD-11 is selected.

Next, when the voltage on the plate line PL-1 rises to a high level, the ferroelectric capacitors C-111, C-111', C-112, and C-112' receive a positive voltage, and therefore they shift their state of polarization from P3 or P4 to P1. This causes the ferroelectric capacitors C-111, C-111', C-112, and C-112' to release electric charges, which induce voltages on the bit lines BL-11, BL-11', BL-12, and BL-12' through the wiring capacitance of these bit lines.

The amount of electric charge released from the ferroelectric capacitors C-111, C-111', C-112, and C-112' varies depending on whether their state of polarization is at P3 or P4 before they shift to P1. Specifically, if the state of polarization of a ferroelectric capacitor is at P4 before it shifts to P1, it releases a larger amount of electric charge, and thus induces a higher voltage on a bit line; if the state of polarization of a ferroelectric capacitor is at P3 before it shifts to P1, it releases a smaller amount of electric charge, and thus induces a lower voltage on a bit line.

More specifically, in a case where, out of the two memory cells constituting the address ADD-11 that points to the intersection between the first row and the first column, the one including the ferroelectric capacitors C-111 and C-111' is holding a binary "1" and the other including the ferroelectric capacitors C-112 and C-112' is holding a binary "0", the voltage on the bit line BL-11 is high, and the voltage on the bit line BL-11' is low; on the other hand, the voltage on the bit line BL-12 is low, and the voltage on the bit line BL-12' is high.

Then, the sense amplifier SA-11 is activated, so that it receives the voltages on the bit lines BL-11 and BL-11' and thereby raises the voltage on the data input/output line I/O-1 to a high level, which corresponds to a binary "1"; on the other hand, the sense amplifier SA-12 is also activated, so that it receives the voltages on the bit lines BL-12 and BL-12' and thereby drops the voltage on the data input/output line I/O-2 to a low level, which corresponds to a binary "0".

This marks the end of outputting the two-bit data "1, 0" held at the address ADD-11. Thereafter, the voltages on the plate line PL-1 and the word line WL-1 drop to a low level, and then the voltage on the column line CL-1 drops to a low level. This is the end of the process of data reading.

Here, the voltages that appear on the bit lines during the reading of data are in a range from tens of millivolts to hundreds of millivolts, and therefore the voltage difference between the high level and the low level that appear on the bit lines is considerably small. This makes it difficult, in a ferroelectric memory of the type that uses only one ferroelectric capacitor to hold one bit of data, that is, in a ferroelectric memory composed of so-called 1T1C-type memory cells, to judge whether the voltage appearing on a bit line corresponds to a binary "1" or "0". Thus, with such a ferroelectric memory, there is a high risk that data may be read incorrectly.

By contrast, in a ferroelectric memory composed of 2T2C-type memory cells, it is the difference between the high level and the low level appearing on the bit lines that is used to judge whether a memory cell is holding a binary "1" or "0". This allows the voltage difference between the voltage representing a binary "1" and the voltage representing a binary "0" to be twice as large as in a ferroelectric memory composed of 1T1C-type memory cells, and thus permits more correct reading of data.

After the reading of data from the address ADD-11 that points to the intersection between the first row and the first column, the ferroelectric capacitors C-111, C-111', C-112, and C-112' of that address ADD-11 all shift their state of polarization to P3. This means that, when data is read, the data is erased from the memory cells in which it has been held up to that moment; that is, a ferroelectric memory is a destructive readout (DRO) memory.

Accordingly, after the reading of data, it is necessary to rewrite the data that has been held previously. For this reason, the sense amplifier SA-ix is provided with a latching function, so that, after the reading of data, the sense amplifier SA-ix performs the rewriting of the data that has just been read out.

In the conventional ferroelectric memory described heretofore, when a specific address is accessed, that is, when data is written to or read from, for example, the address ADD-11 that points to the intersection between the first row and the first column, the ferroelectric capacitors C-1ix and C-1ix' that constitute a memory cell at the address ADD-1i get one end connected to the bit lines BL-ix and BL-ix', respectively, and the voltage on the plate line PL-1 undergoes level shifts. Since the ferroelectric capacitors C-1ix and C-1ix' have the other end connected to this plate line PL-1, such access to the address ADD-11 ends in destroying not only the data held at the address ADD-11, but also the data held at all the addresses ADD-1i in the same row as ADD-11. This necessitates that the rewriting of previously held data be performed for all the addresses in the same row as the address that is actually accessed.

Thus, it is necessary to provide each column of addresses with as many sense amplifiers as the number of bits that can be held at one address, and keep all of those sense amplifiers active when one of the addresses associated therewith is accessed. Accordingly, the conventional ferroelectric memory requires an unduly large circuit area and consumes an unduly large amount of electric current.

Moreover, since many ferroelectric capacitors C-h11, C-h11', C-h12, C-h12', . . . , C-hn1, C-hn1', C-hn2, and C-hn2' are connected to the plate line PL-h, the driving of the plate line Pl-h requires a large-capacity plate line driver (not shown). This cannot be achieved without the use of as many MOS transistors, of which each occupies a large area, as the number of plate lines, and thus further increases the circuit area and the current consumption of the conventional ferroelectric memory.

Furthermore, since the rewriting of data is performed for all the addresses in the same row as the actually accessed address, each address is subjected to data writing an extremely large number of times. As a result, the conventional ferroelectric memory suffers from comparatively low reliability and short working life.

SUMMARY OF THE INVENTION

An object of the present invention is to provide a ferroelectric memory that has a smaller circuit area and offers lower current consumption, higher reliability, and a longer working life than ever.

To achieve the above object, according to the present invention, in a ferroelectric memory that employs capacitors having ferroelectric material sandwiched between two electrodes and that stores data by switching polarization direction of the capacitors, those capacitors which have a common address have one end connected commonly through a first switching device to a divided plate line, and have the other end connected individually through a second switching device to separate bit lines; the first and second switching devices have their gate connected commonly to a word line; the bit lines are connected through a third switching device to a common data line; the divided plate line is connected through a fourth switching device to a plate line; and the third and fourth switching devices have their gate connected commonly to a column line.

In this ferroelectric memory, when a particular address is accessed, only those ferroelectric capacitors that are included in the memory cells corresponding to that address are connected between the plate line, whose voltage undergoes level shifts during the writing or reading of data, and the data input/output line, through which data is input and output. Accordingly, at the addresses other than the one actually accessed, the ferroelectric capacitors constituting the memory cells get one end connected to the bit lines, but, since the bit lines are not connected to the data input/output line, and these ferroelectric capacitors do not have the other end connected to the plate line, it never occurs that the data that has been held previously is destroyed. Thus, it is possible to perform address-by-address reading and writing of data.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
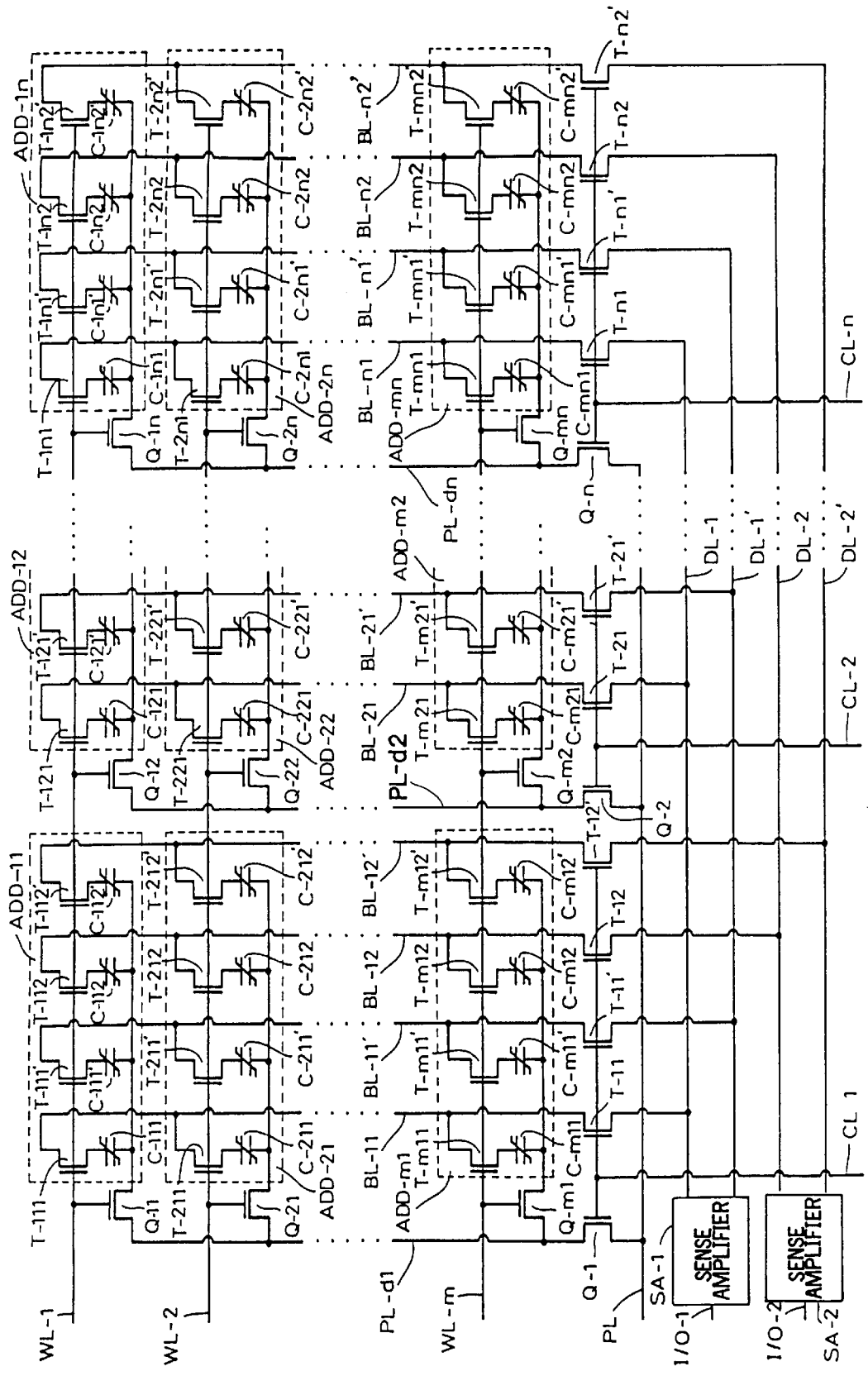
FIG. 1 is a circuit diagram of a ferroelectric memory embodying the invention.
Figure 2:
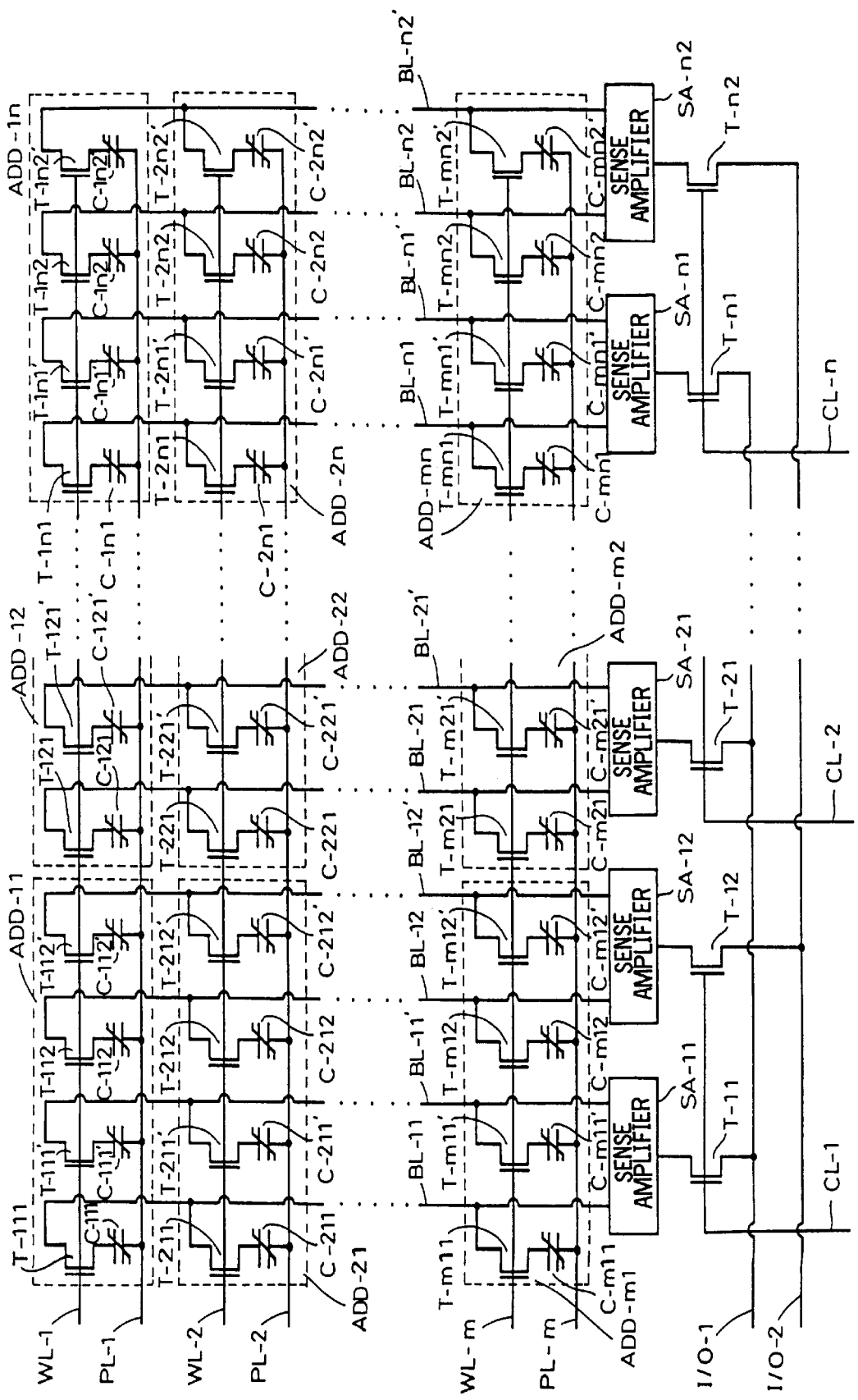
FIG. 2 is a circuit diagram of a conventional ferroelectric memory.
Figure 3:
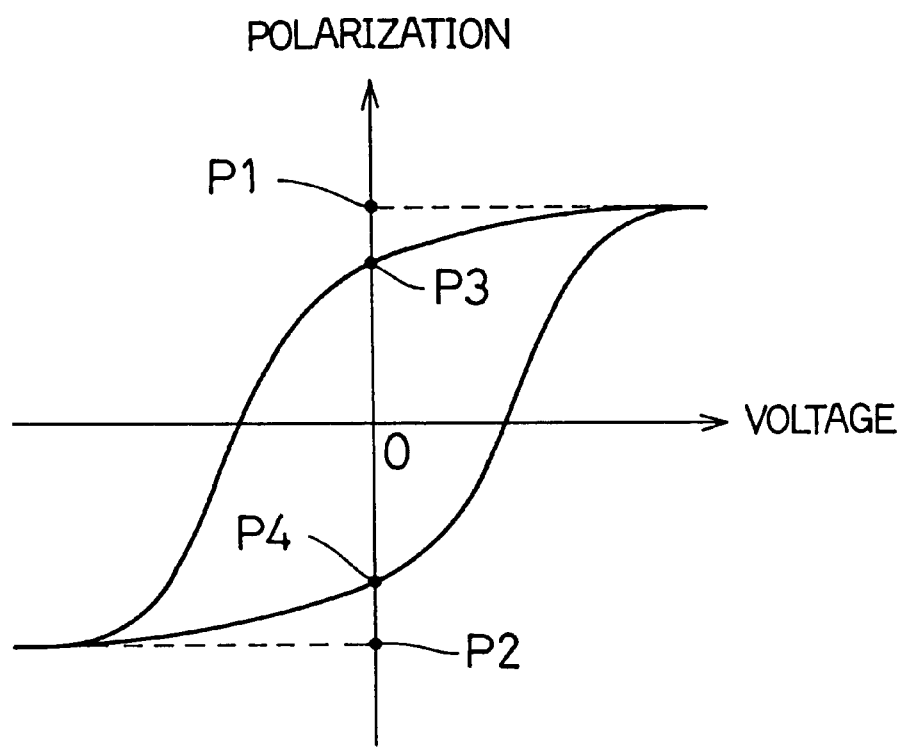
FIG. 3 is a diagram illustrating the polarization of a ferroelectric capacitor.

Hereinafter, an embodiment of the present invention will be described with reference to the drawings. FIG. 1 is a circuit diagram of a ferroelectric memory embodying the invention. In FIG. 1, PL represents a plate line; PL-di (i= 1, . . . , n) represents a divided plate line; DL-1, DL-1', DL-2, and DL-2' represent common data lines; SA-1 and SA-2 represent sense amplifiers; T-i1', T-i2', Q-hi (h=1, . . . , m) and Q-i represent MOS transistors (n-channel MOS field-effect transistors). Note that, in FIG. 1 and in the following descriptions, such elements as are found also in the conventional ferroelectric memory shown in FIG. 2 are identified with the same reference symbols, and overlapping explanations will not be repeated.

These elements are interconnected as follows. The ferroelectric capacitors C-hi1, C-hi1', C-hi2, and C-hi2' have one end connected through the drain-source channel of the MOS transistors T-hi1, T-hi1', T-hi2, and T-hi2', whose gates are connected to the word line WL-h, to the bit lines BL-i1, BL-i1', BL-i2, and BL-i2', respectively. The ferroelectric capacitors C-hi1, C-hi1', C-hi2, and C-hi2' have the other end connected through the drain-source channel of the MOS transistor Q-hi, whose gate is connected to the word line WL-h, to the divided plate line PL-di. The divided plate line PL-di is connected through the drain-source channel of the MOS transistor Q-i, whose gate is connected to the column line CL-i, to the plate line PL.

The MOS transistors T-i1, T-i1', T-i2, and T-i2' have their gate connected to the column line CL-i, and, through the drain-source channel of these MOS transistors, the bit lines BL-i1, BL-i1', BL-i2, and BL-i2' are connected to the common data lines DL-1, DL-1', DL-2, and DL-2', respectively.

The common data lines DL-1 and DL-1' are connected to one end of the sense amplifier SA-1, and the common data lines DL-2 and DL-2' are connected to one end of the sense amplifier SA-2. The sense amplifiers SA-1 and SA-2 have the other end connected to the data input/output lines I/O-1 and I/O-2, respectively.

In this ferroelectric memory, the writing or reading of data is performed through the manipulation of the voltages on relevant lines in almost the same manner as in the conventional ferroelectric memory described previously (note however that, in this embodiment, the plate line PL serves as the plate line PL-h of the conventional example). The main difference here is that, when the word line WL-h and the column line CL-i rise to a high level, selecting the address ADD-hi that points to the intersection between the h-th row and the i-th column, the MOS transistors Q-hi, Q-h2, . . . , and Q-hn and the MOS transistor Q-i turn on, and thereby cause only those ferroelectric capacitors C-hix and C-hix' which constitute a memory cell at that address to be connected between the plate line PL and the input/output line I/O-x.

On the other hand, at the addresses other than the address ADD-hi that is actually addressed, the ferroelectric capacitors that constitute memory cells there get one end connected to the bit lines, but, since the bit lines are not connected to the common data lines, and these ferroelectric capacitors do not have the other end connected to the plate line, whose voltage undergoes level shifts during the writing or reading of data, it does not occur that the data that is held previously there is destroyed.

This means that the rewriting of data needs to be performed only for the address that is actually accessed. As a result, the ferroelectric memory of the embodiment allows the bit lines BL-i1, BL-i1', BL-i2, and BL-i2' to be connected collectively to the sense amplifier SA-x through the common data lines DL-1, DL-1', DL-2, and DL-2', and thus requires only as few sense amplifiers as the number of bits that can be held at one address, that is, only two sense amplifiers. This contributes to the reduction of the circuit area and of the current consumption.

Moreover, since the maximum number of ferroelectric capacitors that are connected to the plate line PL at a time equals the number of ferroelectric capacitors that exist at one address (four in this embodiment), the driving of the plate line PL does not require a large-capacity plate line driver circuit. In addition, since the writing and reading of data can be controlled by a single plate line PL regardless of the address that is accessed, the driving of the plate line PL requires only one plate line driver circuit. This contributes to further reduction of the circuit area and of the current consumption.

Furthermore, since the rewriting of data is performed only for the address that is accessed, each address is subjected to data writing a far smaller number of times. This helps to increase the reliability and the working life of the ferroelectric memory.

As described heretofore, with a ferroelectric memory according to the present invention, it is possible to reduce the number of required sense amplifiers having a latching function to as few as the number of bits that are held at one address, and it is possible to drive the plate line by use of only one plate line driver circuit of moderate capacity. As a result, it is possible to greatly reduce the circuit area and the current consumption. Moreover, it is possible to reduce the number of times of data writing to which each address is subjected, and thus it is possible to increase the reliability and the working life of the ferroelectric memory.

Although the embodiment described above is designed to store two binary digits at one address, it is also possible to design it to store only one binary digit at one address by omitting the capacitors C-hi2 and C-hi2', the transistors T-hi2 and T-hi2', the bit lines BL-i2 and BL-i2', the transistors T-i2 and T-i2', the data lines DL-2 and DL-2', the sense amplifier SA-2, and the input/output line I/O-2. To the contrary, it is also possible to design it to store three or more binary digits at one address by providing more of the above-mentioned elements.

Although the embodiment described above is designed to use different polarization directions of a capacitor to represent a binary "1" and "0", it is also possible to design it to use different degrees of polarization of a capacitor, i.e. the amount of electric charge accumulated therein, to represent a binary digit. In that case, the writing and reading of data needs to be controlled in a different manner from in the above-described embodiment: for example, a binary "1" is represented by shifting the state of polarization of the capacitor C-hi1 to P3 and shifting that of the capacitor C-hi1' to P4, and a binary "0" is represented by shifting the state of polarization of both capacitors C-hi1 and C-hi1' to P3 or P4.

The present invention, which makes it possible to access a specific address without affecting the other addresses, is applicable not only to a memory that employs ferroelectric capacitors, but also to a memory that employs capacitors of any other type as its data-storage elements.

Obviously, many modifications and variations of the present invention are possible in light of the above teachings. It is therefore to be understood that within the scope of the appended claims, the invention may be practiced other than as specifically described.

What is claimed is:

1. A ferroelectric memory that employs capacitors having ferroelectric material sandwiched between two electrodes and that stores data by switching polarization direction of the capacitors.

wherein, out of said capacitors, a set of capacitors that have a common address have one end connected commonly through a first switching device to a divided plate line, and have the other end connected individually through a second switching device to separate bit lines, said first and second switching devices having their gate connected commonly to a word line, said bit lines being connected through a third switching device to a common data line, said divided plate line being connected through a fourth switching device to a plate line, said third and fourth switching devices having their gate connected commonly to a column line, so that reading or writing of data can be performed address by address when particular addresses are accessed.

2. A ferroelectric memory as claimed in claim 1, wherein said plate line is driven by a driving circuit that can only exert so much power as is required to perform address-by-address reading or writing of data when particular addresses are accessed.

3. A memory having addresses mapped logically in a matrix having a predetermined number of rows and a predetermined number of columns, comprising:

a first line provided for each row of addresses for specifying a particular row;

a second line provided for each column of addresses for specifying a particular column:

a third line provided for each column of addresses for internal relaying;

a fourth line provided for each column of addresses for internal relaying;

a fifth line common to all addresses for input and output;

a sixth line common to all addresses for input and output;

a capacitor provided for each address for storing a binary digit;

a first switching device provided for each address, said first switching device being connected to said first line so that conduction of said first switching device is controlled by said first line, said first switching device connecting a first electrode of said capacitor to said third line when said first switching device is in a conducting state;

a second switching device provided for each address, said second switching device being connected to said first line so that conduction of said second switching device is controlled by said first line, said second switching device connecting a second electrode of said capacitor to said fourth line when said second switching device is in a conducting state;

a third switching device provided for each column of addresses, said third switching device being connected to said second line so that conduction of said third switching device is controlled by said second line, said third switching device connecting said fourth line to said fifth line when said third switching device is in a conducting state; and a fourth switching device provided for each column of addresses, said fourth switching device being connected to said second line so that conduction of said fourth switching device is controlled by said second line, said fourth switching device connecting said third line to said sixth line when said fourth switching device is in a conducting state, wherein input or output of data to or from a particular address is performed by connecting to said fifth and sixth lines only a capacitor at an address determined as an intersection between a row specified by said first line and a column specified by said second line.

4. A memory as claimed in claim 3, wherein said capacitor is a ferroelectric capacitor having ferroelectric material sandwiched between two electrodes.

5. A memory as claimed in claim 3, wherein a binary digit is stored as a direction of polarization of said capacitor.

6. A memory as claimed in claim 5, wherein two pairs of said capacitor and said first switching device are provided for each address, two pairs of said third line and said fourth line are provided for each column of addresses, and two of said sixth line are provided in the entire memory, so that a binary digit is stored by polarizing two capacitors associated with a particular address in opposite directions.

7. A memory as claimed in claim 3, wherein a binary digit is stored as amount of electric charge accumulated in said capacitor.

8. A memory as claimed in claim 3, wherein a plurality of pairs of said capacitor and said first switching device are provided for each address, a plurality of pairs of said third line and said fourth line are provided for each column of addresses, and a plurality of said sixth line is provided in the entire memory, so that a plurality of binary digits are stored at one address.

* * * * *